United States Patent
Guo

(10) Patent No.: US 10,424,450 B2
(45) Date of Patent: Sep. 24, 2019

(54) CURRENT FEEDBACK-TYPE ELECTRONIC ARC-EXTINGUISHING APPARATUS

(71) Applicant: GUANGZHOU KINGSER ELECTRONICS CO., LTD, Guangzhou, Guangdong (CN)

(72) Inventor: Qiaoshi Guo, Guangdong (CN)

(73) Assignee: GUANGZHOU KINGSER ELECTRONICS CO., LTD, Guangzhou, Guangdong (CN)

( * ) Notice: Subject to any disclaimer, the term of this patent is extended or adjusted under 35 U.S.C. 154(b) by 349 days.

(21) Appl. No.: 15/256,905

(22) Filed: Sep. 6, 2016

(65) Prior Publication Data

US 2016/0372285 A1 Dec. 22, 2016

Related U.S. Application Data

(63) Continuation of application No. PCT/CN2015/071327, filed on Jan. 22, 2015.

(30) Foreign Application Priority Data

Mar. 7, 2014 (CN) .......................... 2014 1 0093455
Mar. 7, 2014 (CN) .......................... 2014 1 0093471
(Continued)

(51) Int. Cl.
*H01H 47/18* (2006.01)
*H01H 9/30* (2006.01)
(Continued)

(52) U.S. Cl.
CPC .............. *H01H 47/18* (2013.01); *H01H 9/30* (2013.01); *H01H 9/542* (2013.01); *H03K 17/16* (2013.01); *H01H 2009/545* (2013.01)

(58) Field of Classification Search
CPC .......... H02H 9/30; H01H 47/18; H01H 9/542; H01H 9/30; H01H 2009/345; H03K 17/16
(Continued)

(56) References Cited

U.S. PATENT DOCUMENTS 4,392,171 A * 7/1983 Kornrumpf ............ H01H 9/542
361/13
6,643,112 B1 11/2003 Carton et al.
(Continued)

FOREIGN PATENT DOCUMENTS

CN 101266888 A 9/2008
CN 101645370 A 2/2010
(Continued)

OTHER PUBLICATIONS

State Intellectual Property Office of the P.R. China (ISR/CN), "International Search Report for PCT/CN2015/071327", China, dated Apr. 24, 2015.
(Continued)

*Primary Examiner* — Dharti H Patel
(74) *Attorney, Agent, or Firm* — Tim Tingkang Xia, Esq.; Locke Lord LLP

(57) ABSTRACT

The invention relates to a current-feedback electronic arc-extinguishing apparatus suitable for implementing arc extinguishing on a mechanical switch. The current-feedback electronic arc-extinguishing apparatus includes a power semiconductor device which is connected to a mechanical switch in parallel, and a power supply circuit, where a main loop of the power semiconductor device is connected to a current sensor for detecting whether the mechanical switch is switched off; an output signal of the current sensor is connected to a control circuit, and a control port of the power semiconductor device is connected to the control circuit; the
(Continued)

power supply circuit is connected to the control circuit, and the power supply circuit supplies power to the control circuit; and when the current sensor detects that the mechanical switch is switched off, the control circuit controls the power semiconductor device to cut off.

24 Claims, 2 Drawing Sheets

(30) Foreign Application Priority Data

Mar. 7, 2014 (CN) .................. 2014 2 0115758 U
Mar. 7, 2014 (CN) .................. 2014 2 0116613 U

(51) Int. Cl.
*H01H 9/54* (2006.01)
*H03K 17/16* (2006.01)

(58) Field of Classification Search
USPC .................................. 361/2–6, 13
See application file for complete search history.

(56) References Cited

U.S. PATENT DOCUMENTS

2010/0254046 A1* 10/2010 Liu .................. H01H 9/542
  361/8
2011/0222191 A1* 9/2011 Henke .................. H01H 9/542
  361/2

FOREIGN PATENT DOCUMENTS

| | | |
|---|---|---|
| CN | 102349124 A | 2/2012 |
| CN | 103021739 U | 4/2013 |
| EP | 0660348 A1 | 6/1995 |
| EP | 2575152 A1 | 4/2013 |

OTHER PUBLICATIONS

European Patent Office, "Extended European Search Report for EP Application No. 15757847.7", Munich, Germany, dated Mar. 3, 2017.

* cited by examiner

(12) United States Patent
US 10,424,450 B2

CURRENT FEEDBACK-TYPE ELECTRONIC ARC-EXTINGUISHING APPARATUS

CROSS-REFERENCE TO RELATED APPLICATIONS

This application is a continuation application of International Patent Application No. PCT/CN2015/071327, filed Jan. 22, 2015, which itself claims the priority to Chinese Patent Application Nos. 201420115758.5, 201420116613.7, 201410093471.1 and 201410093455.2, all filed Mar. 7, 2014 in the State Intellectual Property Office of P.R. China, which are hereby incorporated herein in their entireties by reference.

TECHNICAL FIELD

The present invention relates generally to a current feedback-type electronic arc-extinguishing apparatus in the field of electrics, and more particularly, to a current feedback-type electronic arc extinguishing apparatus suitable to be applied to a contactor, a relay, a circuit breaker, and other mechanical switches as the use for arc extinguishing.

BACKGROUND TECHNOLOGY

Currently, in an electric control system, mechanical switches such as a contactor and a relay are widely used to control connection and breaking of a load. However, because an arc chute of common arc extinguishing use only functions when an arc breaks and exits to a particular length, an arc chute of common arc extinguishing use has defects that an arc extinguishing effect is poor, when a load breaks, an arc is great, and as a result, a contactor may be easily burnt.

For the above reasons, the arc extinguishing devices used for the mechanical switch arc suppressing appeared. For example, Chinese Patent No. CN01201907.0, entitled "ELECTRONIC ARC EXTINGUISHER", and Chinese Patent Application No. CN200910306608.6, entitled "PHOTO-ELECTRIC COUPLING BASED HYBRID AC CONTACTOR PASSIVE SWITCH DRIVE CONTROLLER", disclose that by means of connecting a thyristor and a mechanical switch of a contactor in parallel, a power source is connected to a control coil of the contactor; before the mechanical switch of the contactor breaks, a drive signal controlling switch-on of the thyristor is provided; the control coil at the contactor powers off; when the mechanical switch is separated, the thyristor is switched on; discharge delay is performed by a filter capacitor of a power supply circuit; a drive signal disabling switch-on of the thyristor is delayed, and the thyristor cuts off, completing a non-arcing break process.

Because there is a period of uncertain delay from the control coil of the contactor losing power to the mechanical switch breaking, in order to make the thyristor cut-off after the mechanical switch breaks to ensure reliable arc extinguishment, the thyristor needs to be switched on for a relatively long period (usually above tens of milliseconds); arc extinguishment in the controlling manner of closing a control signal in delayed time after the mechanical switch breaks necessarily increases unnecessary redundant switch-on work time of the thyristor, and long switch-on work time of the thyristor causes a poor overload capacity and low reliability of an entire arc extinguishing apparatus.

SUMMARY

One of the objectives of the present invention is to provide a current feedback-type electronic arc extinguishing apparatus with short switch-on time of a power semiconductor device and with high reliability, so as to avoid deficiencies of an existing electronic arc extinguishing apparatus.

The objective of the present invention is achieved by the following technical solution:

A current feedback-type electronic arc extinguishing apparatus includes a power supply circuit and a power semiconductor device which is connected in parallel to a mechanical switch, where a main loop of the power semiconductor device is connected to a current sensor so as to detect switch-off of the mechanical switch; an output signal of the current sensor is connected to a control circuit, and the control circuit is connected to a control port of the power semiconductor device; when the current sensor detects switch-off of mechanical switch, the control circuit controls the power semiconductor device to be cut off.

In the current feedback-type electronic arc extinguishing apparatus, the current sensor is used to detect a switch-on current of the power semiconductor device, the current sensor is a current transformer.

In the current feedback-type electronic arc extinguishing apparatus, the current transformer works in a nonlinear state.

In the current feedback-type electronic arc extinguishing apparatus, the current transformer works in a saturated state.

In the current feedback-type electronic arc extinguishing apparatus, the control circuit includes a trigger switch, and an output signal of the current transformer is connected to an input of the trigger switch.

In the current feedback-type electronic arc extinguishing apparatus, the trigger switch is connected to an output loop of the power supply circuit, and the trigger switch is used to bypass the output loop of the power supply circuit to discharge.

In the current feedback-type electronic arc extinguishing apparatus, the output signal of the current transformer is connected to the input of the trigger switch by using a rectifying circuit.

In the current feedback-type electronic arc extinguishing apparatus, the trigger switch is a thyristor, a photoelectric coupler with a thyristor output, or a thyristor equivalent circuit.

In the current feedback-type electronic arc extinguishing apparatus, two ends of the main loop of the power semiconductor device are connected in parallel to a voltage detection circuit, and an output of the voltage detection circuit is connected to the trigger switch so as to control the cut-off of the trigger switch.

In the current feedback-type electronic arc extinguishing apparatus, the trigger switch is connected to a delay electronic switch, and the delay electronic switch is used to shield the trigger switch in a closing process of the mechanical switch.

In the current feedback-type electronic arc extinguishing apparatus, the input of the trigger switch is connected to an overload current detection circuit.

In the current feedback-type electronic arc extinguishing apparatus, the overload current detection circuit includes a current transformer detecting an overload current, an output signal of the current transformer detecting an overload current is connected to the input of the trigger switch by using a rectifying circuit and a voltage limit device, and an output loop of the current transformer detecting an overload current is connected to a load resistor.

In the current feedback-type electronic arc extinguishing apparatus, the control circuit includes a control switch, an output of the control switch is connected to the control port of the power semiconductor device so as to control a drive signal of the power semiconductor device to be connected to the control port of the power semiconductor device.

In the current feedback-type electronic arc extinguishing apparatus, a control port of the control switch is connected to the trigger switch.

In the current feedback-type electronic arc extinguishing apparatus, the power supply circuit is connected to the control switch so as to drive the control switch.

In the current feedback-type electronic arc extinguishing apparatus, the control circuit further includes an oscillation circuit, a transformer, and a rectifying filtering circuit, where the oscillation circuit is connected to the control port of the power semiconductor device by using the transformer, the rectifying filtering circuit, and the control switch.

In the current feedback-type electronic arc extinguishing apparatus, the control switch is a photoelectric coupler or an electromagnetic relay.

In the current feedback-type electronic arc extinguishing apparatus, two ends of the main loop of the power semiconductor device are connected in parallel to a voltage detection circuit, and an output of the voltage detection circuit is connected to the power supply circuit or the control circuit.

In the current feedback-type electronic arc extinguishing apparatus, the voltage detection circuit is used to bypass the power supply circuit.

In the current feedback-type electronic arc extinguishing apparatus, the voltage detection circuit is used to control the output loop of the power supply circuit to bypass and discharge.

In the current feedback-type electronic arc extinguishing apparatus, the main loop of the power semiconductor device is connected in parallel to a voltage detection circuit, an output of the voltage detection circuit is connected to the control circuit or the power supply circuit, the voltage detection circuit is used to detect closing of the mechanical switch, the control circuit provides a control signal to switch on the power semiconductor device when the mechanical switch is closed, so as to control the mechanical switch to perform arc extinguishment in a closed bounce manner.

In the current feedback-type electronic arc extinguishing apparatus, the control circuit is connected to the power semiconductor device by using a control switch.

In the current feedback-type electronic arc extinguishing apparatus, the control switch is an electromagnetic relay.

In the current feedback-type electronic arc extinguishing apparatus, a coil drive loop of the electromagnetic relay is connected to a circuit used to inhibit a reverse current of the coil.

In the current feedback-type electronic arc extinguishing apparatus, the power semiconductor device is a half-controlled semiconductor device or a full-controlled semiconductor device.

In the current feedback-type electronic arc extinguishing apparatus, the half-controlled semiconductor device is a thyristor.

Working principle thereof is: in a working process that the mechanical switch connected in parallel to the current feedback-type electronic arc extinguishing apparatus breaks, the current feedback-type electronic arc extinguishing apparatus of the present invention first provides a drive signal to the control port of the power semiconductor device; when a voltage at the two ends of the mechanical switch is great enough to switch on the power semiconductor device, the power semiconductor device switches on; at the moment when the mechanical switch breaks, the current is bypassed by using the power semiconductor device, and the mechanical switch breaks in a non-arcing manner; when the power semiconductor device switches on, a current passes, the current sensor connected to the power semiconductor device gets a current signal; the current signal is fed back to the control circuit by the current sensor, and the control circuit immediately controls power semiconductor device to cut off, implementing an objective of fast cut-off of the power semiconductor device.

The present invention is reasonably designed; the current sensor is connected to the main loop of the power semiconductor device; because work time of a passing current of the power semiconductor device is short and is of milliseconds, a wire of the main loop of the power semiconductor device can be very small and is capable of bearing a very great working current; once the mechanical switch connected to the apparatus breaks, the power semiconductor device is immediately switched on; the apparatus uses the current signal fed back by the current sensor connected to the power semiconductor device, and the control circuit immediately controls the power semiconductor device to cut off, implementing an objective of fast cut-off of the power semiconductor device.

DETAILED DESCRIPTION

Figure 1:
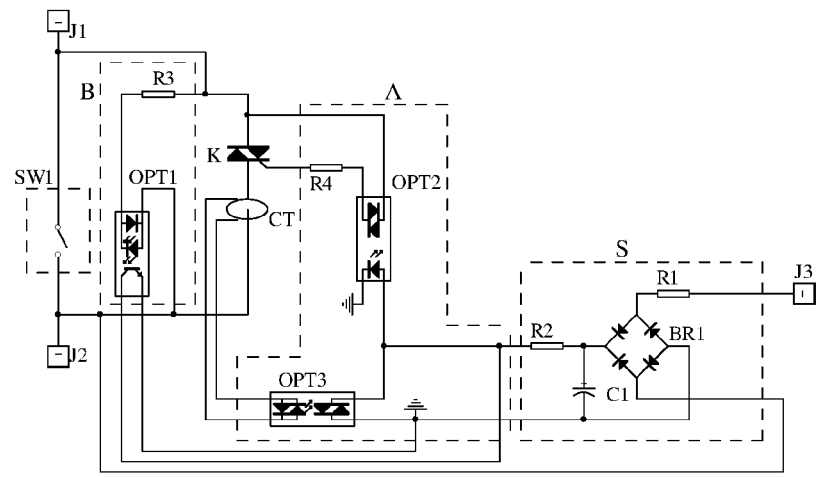
FIG. 1 shows schematically a circuit diagram of a current feedback-type electronic arc extinguishing apparatus according to Embodiment 1 of the present invention.

FIG. 1 shows an embodiment of a current feedback-type electronic arc extinguishing apparatus of the present invention, including: a power semiconductor device K, a power supply circuit (S), a current transformer CT, a control circuit (A), and a voltage detection circuit (B). A mechanical switch SW1 connected to the apparatus is a mechanical switch requiring arc extinguishment; J1 and J2 ends are the common input and output points of the power semiconductor device K connected in parallel to the mechanical switch SW1.

The power semiconductor device K: it is a thyristor, a drive loop of the thyristor K is connected to the control circuit (A), a drive energy of the thyristor K is connected to a trigger electrode of the thyristor K by a main loop of the thyristor K by using a control loop of the control circuit (A).

The power supply circuit (S): an input power source is provided by the output point J2 of the main loop of the thyristor K, and the J3 point is another power source point connected to a load; the input power source is subjected to voltage drop by a resistor R1, rectification by a rectifying circuit BR1, energy storage and filtering by a capacitor C1, and then go by a resistor R2, to supply power to driving of a the control switch OPT2 of the control circuit (A).

The current transformer CT: the current transformer CT is connected to the main loop of the thyristor K, for example, in a cross-core connection shown in FIG. 1. In one embodiment, it may also be in a serial connection. The cross-core connection and the serial connection have the same working principles.

The control circuit (A): it includes a trigger switch OPT3 (which is a photoelectric coupler with a thyristor output) and the control switch OPT2 (which is a photoelectric coupler with a thyristor output), where an input of the trigger switch OPT3 is connected to an output of the current transformer CT; an output of the trigger switch OPT3 is connected to a drive loop of the control switch OPT2; the output of the trigger switch OPT3 and the drive loop of the control switch OPT2 are connected to an output loop of the power supply circuit (S); and the control circuit (A) is connected to the drive loop of the thyristor K by using the control switch OPT2.

The voltage detection circuit (B): it includes a current limit resistor R3 and a photoelectric coupler OPT1, where an input of the photoelectric coupler OPT1 is connected to two ends of the main loop of the thyristor K by using the current limit resistor R3, and an output of the photoelectric coupler OPT1 is connected to the control circuit (A), that is, being connected to the output loop of the power supply circuit (S); and an output signal of the photoelectric coupler OPT1 controls an output loop of the power supply circuit (S) to discharge (note: when the photoelectric coupler OPT1 is a photoelectric coupler with a thyristor output, the output of the photoelectric coupler OPT1 can also be connected to an alternating current input of the rectifying circuit BR1, to bypass the power supply circuit (S); working principles are the same).

Working process is: taking this apparatus used for mechanical switch SW1 arc extinguishing as an example, when the mechanical switch SW1 is closed, the power supply circuit (S) powers on, and an alternating current power source is subjected to voltage drop by the resistor R1 and rectification by the rectifying circuit BR1 to charge the capacitor C1 and then drives an output of the control switch OPT2 to switch on; because the mechanical switch SW1 is closed, no current passes through the thyristor K; when the mechanical switch SW1 switches off, a drive current of the thyristor K drives the thyristor K to switch on by using the control switch OPT2 of the control circuit (A) and a current limit resistor R4; when a current passes through the thyristor K, an output signal of the current transformer CT connected in series to the thyristor K triggers the trigger switch OPT3 of the control circuit (A) to switch on to bypass the output loop of the power supply circuit (S) to discharge, a drive signal of the control switch OPT2 is bypassed, and the thyristor K is automatically closed when a current passes zero; charges of the filter capacitor C1 of the power supply circuit (S) are quickly discharged by using the resistor R2 and the trigger switch OPT3 of the control circuit (A); after the thyristor K cuts off, when the voltage detection circuit (B) detects a voltage, an output bypass the output loop of the power supply circuit (S) to discharge, so that the trigger switch OPT3 of the control circuit (A) resets and cuts off, preparing for a next working cycle.

In Embodiment 1, the power semiconductor device uses a bidirectional thyristor, and the control switch OPT2 uses a photoelectric coupler with a thyristor output, which has characteristics of low drive energy consumption, a fast closing speed, short switch-on time of the power semiconductor device, a low cost, and a simple circuit; the trigger switch OPT3 is a photoelectric coupler with a thyristor output, it's best to use the device input by double light emitting diodes or input by a single light emitting diode with a full-wave rectifying circuit added at the front in this case, half-cycle switch-on work time of the thyristor K can be shortened, further improving reliability and economy of the thyristor K; the current limit resistor R4 of the triggering loop of the thyristor K is not essential; for example, the current limit resistor may be omitted when built in the thyristor K. By means of application of the voltage detection circuit (B), not only the trigger switch OPT3 can reset and cut off, but also the output loop of the power supply circuit (S) can be bypassed and discharged, greatly improving a secondary arc extinguishing response speed of the current feedback-type electronic arc extinguishing apparatus of the present invention.

Figure 2:
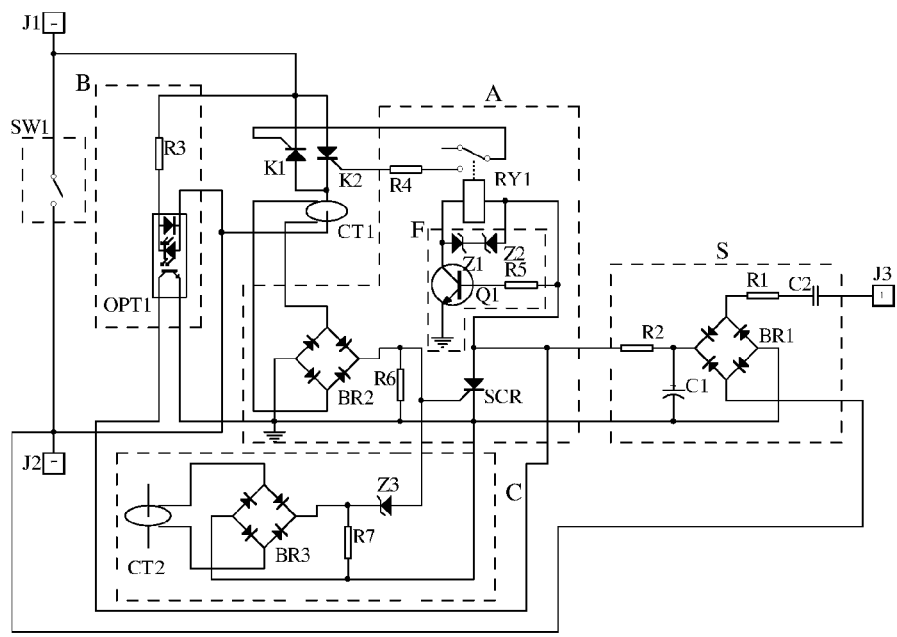
FIG. 2 shows schematically a circuit diagram of a current feedback-type electronic arc extinguishing apparatus according to Embodiment 2 of the present invention.

FIG. 2 shows Embodiment 2 of an current feedback-type electronic arc extinguishing apparatus of the present invention, including: power semiconductor devices K1 and K2, a power supply circuit (S), a current transformer CT1, a control circuit (A), a voltage detection circuit (B), and an overload current detection circuit (C); a mechanical switch SW1 is a mechanical switch requiring arc extinguishment and connected to the apparatus; J1 and J2 ends are the common input and output of the main loops of the power semiconductor devices K1 and K2 connected in parallel to the mechanical switch SW1.

The power semiconductor devices K1 and K2: they use two thyristors K1 and K2 (note: they are unidirectional thyristors) to be connected in parallel in a reverse direction, drive energies of the thyristors K1 and K2 are provided to trigger electrodes of the thyristors K1 and K2 by the main loops by using a control loop of the control circuit;

The current transformer CT1: the current transformer CT1 is connected to the main loops of the thyristors K1 and K2 (the drawing shows cross-core connection, and can also be serial connection; cross-core connection and serial connection have the same working principles).

The control circuit (A): it includes a trigger switch SCR (which is a unidirectional thyristor) and a control switch RY1 (which is an electromagnetic relay), where an input of the trigger switch SCR is connected to an output of the current transformer CT1 by using a rectifying circuit BR2; the trigger switch SCR and a drive loop of the control switch RY1 are connected to an output loop of the power supply circuit (S); the control circuit (A) is connected to drive loops of the thyristor K1 and K2 by using the control switch RY1; a control coil of the control switch RY1 is connected to a relay coil reverse current inhibiting circuit (F).

The power supply circuit (S): an input power source is provided by an output point J2 of the main loops of the thyristors K1 and K2, and a J3 point is another power source point connected to a load; the input power source is subjected to voltage drop by a capacitor C2, current limit by a resistor R1, rectification by a rectifying circuit BR1, energy storage and filtering by C1, and then go by a resistor R2, to supply power to driving of control switch RY1 of the control circuit (A).

The voltage detection circuit (B): it includes a current limit resistor R3 and a photoelectric coupler OPT1, where an input of the photoelectric coupler OPT1 is connected to the two ends of the main loops of the thyristors K1 and K2 by using the current limit resistor R3, and an output of the photoelectric coupler OPT1 is connected to the control circuit (A), that is, being connected to the output loop of the power supply circuit (S); and an output signal of the photoelectric coupler OPT1 controls an output loop of the power supply circuit (S) to bypass and discharge (it is noted that when the photoelectric coupler OPT1 is a photoelectric coupler with a thyristor output, the output of the photoelectric coupler OPT1 may also be connected to an alternating current input of the rectifying circuit BR1, to bypass the power supply circuit (S); working principles are the same).

The overload current detection circuit (C): the detection circuit includes a current transformer CT2 detecting an overload current (note: the transformer CT2 detecting an overload current is used to be connected to a main loop of the load); an output signal of the current transformer CT2 detecting an overload current is connected to an input of the trigger switch SCR of the control circuit (A) by using a rectifying circuit BR3, a load resistor R7, and a voltage limit semiconductor device Z3.

Working process is: taking this apparatus used for mechanical switch SW1 arc extinguishing as an example, when the mechanical switch SW1 is closed, the power supply circuit (S) powers on, and an alternating current power source is subjected to voltage drop by the capacitor C2, current limit by the resistor R1, and rectification by the rectifying circuit BR1 to charge the capacitor C1 and drives an output contact of the control switch RY1 to be closed; because the mechanical switch SW1 is closed, no current passes through the thyristors K1 and K2; when the mechanical switch SW1 switches off, drive currents of the thyristors K1 and K2 go by the control switch RY1 of the control circuit (A) and a current limit resistor R4 drive the thyristors K1 and K2 to switch on; when a current passes through either of the thyristors K1 and K2, an output signal of the current transformer CT1 connected in series to either of the thyristors K1 and K2, by means of rectification of the rectifying circuit BR2, trigger the trigger switch SCR of the control circuit (A) to switch on, to bypass the output loop of the power supply circuit (S) to discharge; a drive signal of the control switch RY1 is bypassed; a triode Q1 of the relay coil reverse current inhibiting circuit (F) connected to the control switch RY1 cuts off; a reverse current of the control switch RY1 is released by using the voltage stabilizing diodes (e.g., zener diodes) Z1 and Z2; a mechanical contact of the control switch RY1 is quickly released; and the thyristors K1 and K2 are automatically closed when a current crosses zero (only one thyristor of K1 and K2 needs to be switched on in an arc extinguishing working process, and working time may reach half a cycle at least); charges of the capacitor C1 of the power supply circuit (S) are quickly discharged by using R2 and the trigger switch SCR; after the thyristors K1 and K2 switch off, when the voltage detection circuit (B) detects a voltage, an output bypass the output loop of the power supply circuit (S) to discharge, so that the trigger switch SCR of the control circuit (A) resets and cuts off, preparing for a next working cycle. If the mechanical switch SW1 is in a closed state, when the overload current detection circuit (C) detects that the overload current exceeds a maximum load current of the thyristors K1 and K2, the trigger switch SCR in the control circuit (A) is triggered to switch on, to cut off the control switch RY1; the thyristors K1 and K2 do not switch on when the mechanical switch SW1 breaks, which prevents the apparatus from being damaged, and enables, when the mechanical switch is connected to the current feedback-type electronic arc extinguishing apparatus of the present invention, that an original ultimate current break capacity of the mechanical switch itself is not influenced.

In this embodiment, as compared with using a single bidirectional thyristor, that the power semiconductor device uses two unidirectional thyristors may implement greater overloading and a greater anti false switch-on capacity; besides, as compared with using an electronic switch of a photoelectric coupler with a thyristor output, that the control switch RY1 uses an electromagnetic relay may implement greater overloading, a greater anti false trigger capacity, and a greater voltage endurance capacity. Considering a release delay problem of the electromagnetic relay, the control coil of the control switch RY1 is connected to the relay coil reverse current inhibiting circuit (F), so as to improve a release speed of the control switch RY1 and reduce switch-on work time of the thyristors K1 and K2, which can greatly improve reliability and economy; as compared with that the input of the trigger switch SCR is directly connected to the output of the current transformer CT1, that the input of the trigger switch SCR is connected to the output of the current transformer CT1 by using the rectifying circuit BR2 can shorten half-cycle switch-on work time of the thyristors and further improve reliability of the thyristors. The current limit resistor R4 of the triggering loop of the thyristors K1 and K2 is not essential, for example, the current limit resistor may be omitted when built in the thyristors K1 and K2. By means of application of the voltage detection circuit (B), not only the trigger switch SCR may reset and switch off, but also the output loop of the power supply circuit (S) can be bypassed and discharged, greatly improving a secondary arc extinguishing response speed of the current feedback-type electronic arc extinguishing apparatus of the present invention.

Figure 3:
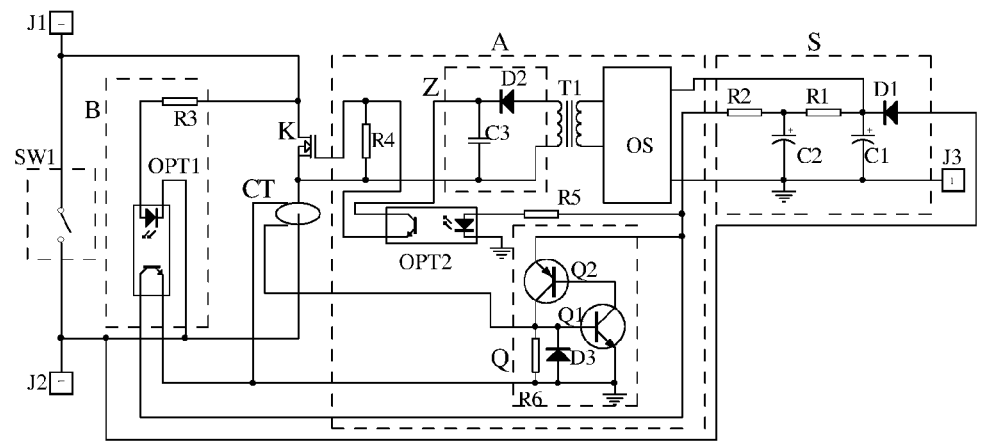
FIG. 3 shows schematically a circuit diagram of a current feedback-type electronic arc extinguishing apparatus according to Embodiment 3 of the present invention.

FIG. 3 shows Embodiment 3 of an current feedback-type electronic arc extinguishing apparatus of the present invention, including: a power semiconductor device K, a current transformer CT, a control circuit (A), a power supply circuit (S), and a voltage detection circuit (B); a mechanical switch SW1 connected to the apparatus is a mechanical switch requiring arc extinguishment; J1 and J2 are common positive input endpoint and output endpoint of a main loop of the power semiconductor device K connected in parallel to the mechanical switch SW1.

The power semiconductor device K: it is a field-effect transistor, and a drive energy thereof is provided by the control circuit (A);

The current transformer CT: the current transformer CT is connected to the main loop of the field-effect transistor K (the drawing shows cross-core connection, and may also be serial connection; cross-core connection and serial connection have the same working principles).

The control circuit (A): it includes a trigger switch (Q) (which is a thyristor equivalent circuit), an oscillation circuit (OS), a transformer T1, a rectifying filtering circuit (Z) consisting of a diode D2 and a capacitor C3, and a control switch OPT2 (which is a photoelectric coupler), where the oscillation circuit (OS) is connected to the power supply circuit (S); the control switch OPT2 is connected to an output of the power supply circuit (S) by using a resistor R5, and controls an output of the trigger switch (Q) to be connected to a control port of the control switch OPT2 and also to be connected to an output loop of the power supply circuit (S); the oscillation circuit (OS) provides a drive energy to a drive loop of the field-effect transistor K by using the transformer T1, the rectifying filtering circuit (Z), and the control switch OPT2.

The power supply circuit (S): an input power source is input by J2 and J3 endpoints, go by the diode D1, and then is filtered by the capacitor C1; one path of the input power source directly supplies power to the oscillation circuit (OS) of the control circuit (A), the other path go by the resistor R1, then is subjected to energy storage and filtering of the capacitor C2, and then go by the resistor R2 to supply power to a drive loop of the control switch OPT2 of the control circuit (A).

The voltage detection circuit (B): it includes a current limit resistor R3 and a photoelectric coupler OPT1, where an input of the photoelectric coupler OPT1 is connected to two ends of the main loop of the field-effect transistor K by using the current limit resistor R3; an output of the photoelectric coupler OPT1 is connected to the control circuit (A), that is, being connected to an output loop of the power supply circuit (S); the output of the photoelectric coupler OPT1 controls an output loop of the power supply circuit (S) to bypass and discharge.

Working process is: for example, for this apparatus is used for arc extinguishing in the DC contactor, when the mechanical switch SW1 is closed, the power supply circuit (S) powers on, the oscillation circuit (OS) of the control circuit (A) powers on and works, then the control switch OPT2 powers on, and an output thereof switches on; the oscillation circuit (OS) works to drive the transformer T1; an output of the transformer T1 passes through the rectifying circuit (Z) and the control switch OPT2 to provide a switch-on bias signal for the field-effect transistor K; because the mechanical switch SW1 is closed, no current passes through the field-effect transistor K; when the mechanical switch breaks, and a bypass current passes through the field-effect transistor K; an output signal of the current transformer CT1 connected in series to the field-effect transistor K triggers triodes Q1 and Q2 of the trigger switch (Q) of the control circuit (A) to switch on; a drive signal of the control switch OPT2 is bypassed, the output of the control switch OPT2 is closed; the field-effect transistor K switches off because of having no bias voltage signal; charges of the capacitor C2 of the power supply circuit (S) are discharged by using R2 and Q1 and Q2 of the trigger switch (Q); after the field-effect transistor K switches off, when the voltage detection circuit (B) detects a voltage, the output bypass the output loop of the power supply circuit (S) to discharge, so that the trigger switch (Q) of the control circuit (A) resets and cuts off, preparing for a next working cycle (note: a phase of output of the current transformer should be paid attention to herein).

In Embodiment 3, the power semiconductor device uses a field-effect transistor, and in an actual application, may also use a full-controlled semiconductor device such as an IGBT; when a full-controlled semiconductor device is used, because a cut-off speed thereof is very great and may reach a microsecond level, when an inductive load is controlled, a diode may be connected in parallel in a reverse manner to the power semiconductor device as protection, or an inbuilt device connected in parallel in a reverse manner to the diode is selected. By means of application of the voltage detection circuit (B), not only the trigger switch (Q) can reset and cut off, but also the output loop of the power supply circuit (S) can be bypassed and discharged, greatly improving a secondary arc extinguishing response speed of the current feedback-type electronic arc extinguishing apparatus of the present invention.

Figure 4:
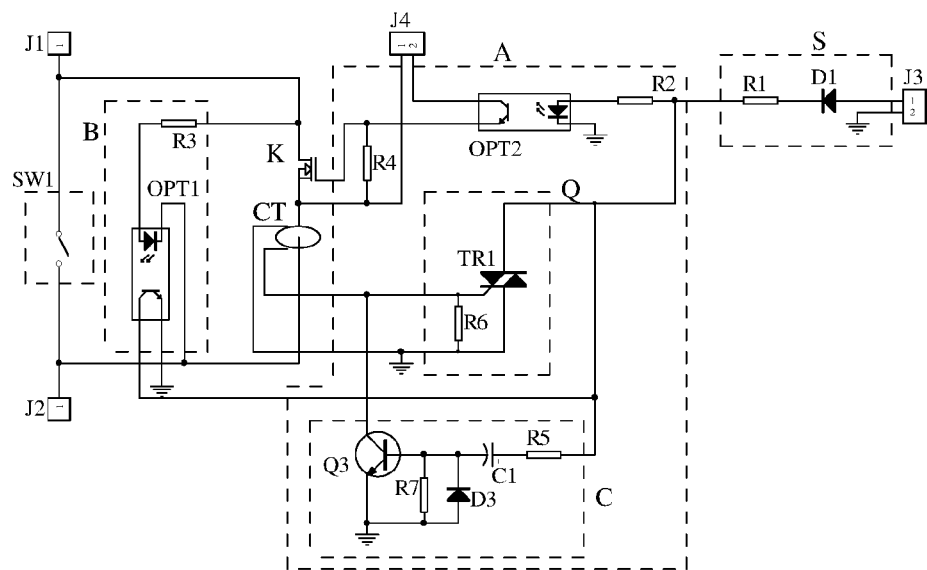
FIG. 4 shows schematically a circuit diagram of a current feedback-type electronic arc extinguishing apparatus according to Embodiment 4 of the present invention.

FIG. 4 shows Embodiment 4 of an current feedback-type electronic arc extinguishing apparatus of the present invention, including: a power semiconductor device K, a current transformer CT, a control circuit (A), a power supply circuit (S), and a voltage detection circuit (B); a mechanical switch SW1 connected to the apparatus is a mechanical switch requiring arc extinguishment; J1 and J2 are common positive input endpoint and output endpoint of the main loop of the power semiconductor device K connected in parallel to the mechanical switch SW1; J4 is used as an input of a drive signal of the power semiconductor device K, and J3 is a power source input of the power supply circuit (S).

The power semiconductor device K: it is a field-effect transistor, and a drive energy thereof is connected to a control electrode thereof by an input of the J4 port by using a control switch OPT2 of the control circuit (A).

The current transformer CT: the current transformer CT is connected to the main loop of the field-effect transistor K (the drawing shows cross-core connection, and may also be serial connection; cross-core connection and serial connection have the same working principles).

The control circuit (A): it includes a trigger switch (Q) (which is a thyristor TR1), a delay electronic switch (C), and a control switch OPT2 (which is a photoelectric coupler), where the control switch OPT2 is connected to an output of the power supply circuit (S) by using a resistor R2; the trigger switch (Q) is connected to a control port of the control switch OPT2, that is, also being connected to an output loop of the power supply circuit (S); a drive signal input by J4 provides a drive energy to a drive loop of the field-effect transistor K after passing through the control switch OPT2; the delay electronic switch (C) is connected to a control port of the trigger switch (Q); the delay electronic switch (C): a control electrode of a transistor Q3 is connected to the power supply circuit by using a resistor R5 and a capacitor C1; the transistor Q3 is connected in parallel to an input of the trigger switch (Q), to bypass an input signal of the trigger switch (Q); a resistor R7 and a diode D3 are connected in parallel to the control port of the transistor Q3, where the resistor R7 is an anti-interference resistor, and the diode D3 is used in reverse discharge of the capacitor C1.

The power supply circuit (S): an input power source is input by the J3 endpoint, and then supplies power by using a resistor R1 and a control port of the control switch OPT2 of the control circuit (A) after passing through the diode D1;

The voltage detection circuit (B): it includes a current limit resistor R3 and a photoelectric coupler OPT1, where an input of the photoelectric coupler OPT1 is connected to two ends of the main loop of the field-effect transistor K by using the current limit resistor R3; an output of the photoelectric coupler OPT1 is connected to the control circuit (A), that is, being connected to an output loop of the power supply circuit (S); the output of the photoelectric coupler OPT1 controls an output loop of the power supply circuit (S) to bypass and discharge; the voltage detection circuit (B) is also used to detect closing of the mechanical switch SW1 herein.

Working process: for example, for this apparatus used for arc extinguishing in a DC contactor, J3 can be connected to a drive coil of the mechanical switch SW1; while the drive coil powers on, the power supply circuit (S) powers on, and the mechanical switch SW1 is closed; once the mechanical switch SW1 is closed, an output of a photoelectric coupler of the voltage detection circuit (B) cuts off, and controls an output of the delay electronic switch (C) to switch on; the control switch OPT2 powers on, and an output thereof switches on; the drive signal provide a switch-on bias signal for the field-effect transistor K by using the control switch OPT2; when closed bounce occurs, the field-effect transistor K switches on, implementing a closed closing arc extinguishing action on the mechanical switch SW1; after the mechanical switch SW1 is stable closed, the output of the delay electronic switch (C) cuts off; when the mechanical switch SW1 breaks, when a bypass current passes through the field-effect transistor K, an output signal of the current transformer CT connected in series to the field-effect transistor K triggers a thyristor TR1 of the trigger switch (Q) of the control circuit (A) to switch on; a drive signal of the control switch OPT2 is bypassed; an output of the control switch OPT2 is closed; the field-effect transistor K cuts off because of having no bias voltage signal; after the field-effect transistor K cuts off, when the voltage detection circuit (B) detects a voltage, an output bypasses the output loop of the power supply circuit (S), so that trigger switch (Q) of the control circuit (A) resets and cuts off, preparing for a next working cycle (note: a phase of output of the current transformer should be paid attention to herein).

In FIG. 4, the delay electronic switch (C) is connected in parallel to the input of the trigger switch (Q); the delay electronic switch may also be connected in series to the input loop of the trigger switch (Q) or the output loop of the trigger switch (Q), so as to shield the trigger switch (Q) in a mechanical switch closing process and enable the trigger switch (Q) not to work; the voltage detection circuit (B) is used for closing detection of the mechanical switch; when the voltage detection circuit (B) is used in arc extinguishment in a closed bouncing manner of the mechanical switch, it is overcome that the power semiconductor device switches on in advance before the mechanical switch is closed, a shock of a large current to the power semiconductor device is reduced when a load is connected, switch-on work time of the power semiconductor device is reduced, improve and reliability thereof is improved.

In the foregoing embodiments, the trigger switch of the control circuit adopt different devices or different circuits to implement, which may be interchanged in an actual application and have same principles, and has advantages of a simple circuit, a low cost, and high reliability. For conciseness and facilitating expression, the foregoing embodiments use a current feedback-type electronic arc extinguishing apparatus applied to a unipolar mechanical switch as embodiments. When electronic arc extinguishment of a biopolar, tripolar, or another multipolar mechanical switch is to be used, it is feasible that a quantity of power semiconductor devices and a quantity of relevant control components are increased (for example, a control circuit of the control switch built-in). Current transformer can be used, the power supply circuit can be shared, and they have the same working principles. In FIG. 4, the delay electronic switch (C) may also be applied to other embodiments, and is used to shield the trigger switch when used for closed arc extinguishing, to disable the trigger switch to work; however, a power source of the power supply circuit cannot be obtained from the output of the main loop of the power semiconductor, but can be obtained from the input of the main loop of the power semiconductor or the power source port of/the control coil of the contactor; when the current feedback-type electronic arc extinguishing apparatus with the voltage detection circuit (B) of the present invention is used, a power source input of the power supply circuit (S) thereof may be connected to any one of the input of the main loop of the power semiconductor, the output of the main loop of the power semiconductor, or the control coil of the contactor; the mechanical switch SW1 may be a mechanical contact of a circuit breaker or a switch such as a contactor, and has advantages of a wide application range and flexible using.

the present invention is reasonably designed; the current sensor is connected to the main loop of the power semiconductor device; because work time of a passing current of the power semiconductor device is short and is of milliseconds, a wire of the main loop of the power semiconductor device can be very small and is capable of bearing a very great working current; therefore, the current sensor can select a miniature current transformer, and enable the current transformer to work in a nonlinear state and a saturated state, it can use a cross-core connection manner, or use a manner of connecting in series the wire of the main loop and the current transformer; the current transformer has characteristics of a small volume and a low cost, so as to form an integrity with an entire apparatus; once the mechanical switch connected to the apparatus breaks, the power semiconductor device is immediately switched on; the apparatus uses the current signal fed back by the current sensor connected to the power semiconductor device, and the control circuit immediately controls the power semiconductor device to cut off, implementing an objective of fast cut-off of the power semiconductor device.

When the power semiconductor device of the current feedback-type electronic arc extinguishing apparatus of the present invention uses a half-controlled semiconductor device, such as a thyristor, as an arc extinguishing device, the switch-on time may reach half a cycle at least; when the power semiconductor device of the current feedback-type electronic arc extinguishing apparatus uses a full-controlled semiconductor device (such as a transistor, or an IGBT or a field-effect transistor, etc), in an arc extinguishing process, switch-on time of the power semiconductor device only needs microseconds, which can achieve an objective of accurate and reliable arc extinguishment, and greatly improves utilization of the power semiconductor device of the electronic arc extinguishing apparatus and reliability, practicability, and economy of the electronic arc extinguishing apparatus; besides, the control circuit uses a trigger switch to be connected to the current transformer, and a signal fed back by the current transformer directly controls the trigger switch to switch on, implementing an objective of fast cut-off of the power semiconductor device.

What is claimed is:

1. A current feedback-type electronic arc extinguishing apparatus, comprising:
   a power supply circuit; and
   a power semiconductor device which is connected to a mechanical switch in parallel,
   wherein a main loop of the power semiconductor device is connected to a current sensor for detecting switch-off of the mechanical switch;
   wherein an output signal of the current sensor is connected to a control circuit, and the control circuit is connected to a control port of the power semiconductor device;
   wherein the control circuit is connected to the power supply circuit, and the power supply circuit supplies power to the control circuit;
   wherein when the current sensor detects switch-off of the mechanical switch, the control circuit controls the power semiconductor device to cut off;
   wherein the control circuit is connected to the power semiconductor device by using a control switch; and
   wherein the control switch is a photoelectric coupler or an electromagnetic relay.

2. The current feedback-type electronic arc extinguishing apparatus according to claim 1, the current sensor is used to detect a switch-on current of the power semiconductor device, wherein the current sensor is a current transformer.

3. The current feedback-type electronic arc extinguishing apparatus according to claim 2, wherein the current transformer works in a nonlinear state.

4. The current feedback-type electronic arc extinguishing apparatus according to claim 2, wherein the current transformer works in a saturated state.

5. The current feedback-type electronic arc extinguishing apparatus according to claim 2, the control circuit includes a trigger switch, and an output signal of the current transformer is connected to an input of the trigger switch.

6. The current feedback-type electronic arc extinguishing apparatus according to claim 5, the trigger switch is connected to an output loop of the power supply circuit, and the trigger switch is used to bypass the output loop of the power supply circuit to discharge.

7. The current feedback-type electronic arc extinguishing apparatus according to claim 5, wherein the output signal of the current transformer is connected to the input of the trigger switch by using a rectifying circuit.

8. The current feedback-type electronic arc extinguishing apparatus according to claim 5, wherein the trigger switch is a thyristor, a photoelectric coupler with a thyristor output, or a thyristor equivalent circuit.

9. The current feedback-type electronic arc extinguishing apparatus according to claim 5, wherein two ends of the main loop of the power semiconductor device are connected in parallel to a voltage detection circuit, and an output of the voltage detection circuit is connected to the trigger switch so as to control the cut-off of the trigger switch.

10. The current feedback-type electronic arc extinguishing apparatus according to claim 5, wherein the trigger switch is connected to a delay electronic switch, and the delay electronic switch is used to shield the trigger switch in a closing process of the mechanical switch.

11. The current feedback-type electronic arc extinguishing apparatus according to claim 5, wherein the input port of the trigger switch is connected to an overload current detection circuit.

12. The current feedback-type electronic arc extinguishing apparatus according to claim 11, wherein the overload current detection circuit includes a current transformer detecting an overload current, an output signal of the current transformer detecting an overload current is connected to the input port of the trigger switch by using a rectifying circuit and a voltage limit device, and an output loop of the current transformer detecting an overload current is connected to a load resistor.

13. The current feedback-type electronic arc extinguishing apparatus according to claim 1, wherein a coil drive loop of the electromagnetic relay is connected to a circuit used to inhibit a reverse current of the coil.

14. The current feedback-type electronic arc extinguishing apparatus according to claim 1, wherein the power semiconductor device is a half-controlled semiconductor device or a full-controlled semiconductor device.

15. The current feedback-type electronic arc extinguishing apparatus according to claim 14, wherein the half-controlled semiconductor device is a thyristor.

16. A current feedback-type electronic arc extinguishing apparatus, comprising:
a power supply circuit and
a power semiconductor device which is connected to a mechanical switch in parallel,
wherein a main loop of the power semiconductor device is connected to a current sensor for detecting switch-off of the mechanical switch;
wherein an output signal of the current sensor is connected to a control circuit, and the control circuit is connected to a control port of the power semiconductor device;
wherein the control circuit is connected to the power supply circuit, and the power supply circuit supplies power to the control circuit;
wherein when the current sensor detects switch-off of the mechanical switch, the control circuit controls the power semiconductor device to cut off; and
wherein two ends of the main loop of the power semiconductor device are connected in parallel to a voltage detection circuit, and an output of the voltage detection circuit is connected to the power supply circuit or the control circuit.

17. The current feedback-type electronic arc extinguishing apparatus according to claim 16, wherein the control circuit comprises a control switch, an output of the control switch is connected to the control port of the power semiconductor device so as to control a drive signal of the power semiconductor device to be connected to the control port of the power semiconductor device.

18. The current feedback-type electronic arc extinguishing apparatus according to claim 17, wherein a control port of the control switch is connected to the trigger switch.

19. The current feedback-type electronic arc extinguishing apparatus according to claim 17, wherein the power supply circuit is connected to the control switch so as to drive the control switch.

20. The current feedback-type electronic arc extinguishing apparatus according to claim 17, wherein the control circuit further includes an oscillation circuit, a transformer, and a rectifying filtering circuit, wherein the oscillation circuit is connected to the control port of the power semiconductor device by using the transformer, the rectifying filtering circuit, and the control switch.

21. The current feedback-type electronic arc extinguishing apparatus according to claim 17, wherein the control switch is a photoelectric coupler or an electromagnetic relay.

22. The current feedback-type electronic arc extinguishing apparatus according to claim 16, wherein the voltage detection circuit is used to bypass the power supply circuit.

23. The current feedback-type electronic arc extinguishing apparatus according to claim 16, wherein the voltage detection circuit is used to control the output loop of the power supply circuit to bypass and discharge.

24. A current feedback-type electronic arc extinguishing apparatus, comprising:
a power supply circuit; and
a power semiconductor device which is connected to a mechanical switch in parallel,
wherein a main loop of the power semiconductor device is connected to a current sensor for detecting switch-off of the mechanical switch;
wherein an output signal of the current sensor is connected to a control circuit, and the control circuit is connected to a control port of the power semiconductor device;
wherein the control circuit is connected to the power supply circuit, and the power supply circuit supplies power to the control circuit;
wherein when the current sensor detects switch-off of the mechanical switch, the control circuit controls the power semiconductor device to cut off; and
wherein the main loop of the power semiconductor device is further connected in parallel to a voltage detection circuit, an output of the voltage detection circuit is connected to the control circuit or the power supply circuit, the voltage detection circuit is used to detect closing of the mechanical switch, the control circuit provides a control signal to switch on the power semiconductor device when the mechanical switch is closed, so as to control the mechanical switch to perform arc extinguishment in a closed bouncing manner.

* * * * *